(12) United States Patent
Shudo et al.

(10) Patent No.: US 11,822,234 B2
(45) Date of Patent: Nov. 21, 2023

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventors: Shinichi Shudo, Saitama (JP); Toshiaki Suzuya, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 33 days.

(21) Appl. No.: 16/928,476

(22) Filed: Jul. 14, 2020

(65) Prior Publication Data
US 2021/0033966 A1 Feb. 4, 2021

(30) Foreign Application Priority Data
Aug. 1, 2019 (JP) .................................. 2019-142522

(51) Int. Cl.
*G03F 7/00* (2006.01)
*H01L 21/027* (2006.01)
*B29C 59/02* (2006.01)

(52) U.S. Cl.
CPC ............ *G03F 7/0002* (2013.01); *B29C 59/02* (2013.01); *H01L 21/0271* (2013.01)

(58) Field of Classification Search
CPC ............. G03F 7/70858; G03F 7/70908; G03F 7/70916; G03F 7/70925; G03F 7/70933;
(Continued)

(56) References Cited

U.S. PATENT DOCUMENTS

2007/0063384 A1    3/2007  Choi
2010/0096764 A1*   4/2010  Lu .................... G03F 7/0002
                                                        425/210
(Continued)

FOREIGN PATENT DOCUMENTS

CN    107479324 A    12/2017
JP    2011-061029 A    3/2011
(Continued)

OTHER PUBLICATIONS

Decision of Refusal issued by the Japanese Patent Office dated Jul. 21, 2023 in corresponding JP Patent Application No. 2019-142522, with English translation.
(Continued)

*Primary Examiner* — S. Behrooz Ghorishi
*Assistant Examiner* — John W Hatch
(74) *Attorney, Agent, or Firm* — Carter, DeLuca & Farrell LLP

(57) ABSTRACT

The present invention provides an imprint apparatus for performing imprint processing of forming a pattern of an imprint material on a substrate by using a mold, the imprint apparatus including a forming unit including an outlet configured to blow out a gas towards the substrate side from the mold side and configured to form, by the gas, an air flow that surrounds a space between the mold and the substrate, and a control unit configured to control the forming unit when the imprint processing is consecutively performed on a plurality of shot regions on the substrate after an uncured imprint material has been supplied thereto.

14 Claims, 8 Drawing Sheets

(58) Field of Classification Search
CPC ..... G03F 7/0002; B29C 59/02; B29C 59/022; B29C 2059/023
See application file for complete search history.

(56) References Cited

U.S. PATENT DOCUMENTS

2016/0297116 A1* 10/2016 Toyoshima ............. B29C 43/56
2017/0285467 A1* 10/2017 Nakayama ............. H01L 21/00
2021/0080827 A1* 3/2021 Shudo ................... G03F 7/0002

FOREIGN PATENT DOCUMENTS

| JP | 2012-506146 | A |   | 3/2012  |         |           |
|----|-------------|---|---|---------|---------|-----------|
| JP | 5084823     | B2|   | 11/2012 |         |           |
| JP | 2015-023237 | A |   | 2/2015  |         |           |
| JP | 2015-138842 | A |   | 7/2015  |         |           |
| JP | 2015167204  | A | * | 9/2015  | ........... | G03F 7/0002 |
| JP | 2016201485  | A |   | 12/2016 |         |           |
| JP | 2017-183416 | A |   | 10/2017 |         |           |
| JP | 2017-199876 | A |   | 11/2017 |         |           |
| JP | 2018-006553 | A |   | 1/2018  |         |           |
| JP | 2019-071386 | A |   | 5/2019  |         |           |
| WO | 2007120537  | A2|   | 10/2007 |         |           |

OTHER PUBLICATIONS

Notice of Reasons for Refusal issued by the Japan Patent Office dated Apr. 17, 2023 in corresponding JP Patent Application No. 2019-142522, with English translation.

* cited by examiner

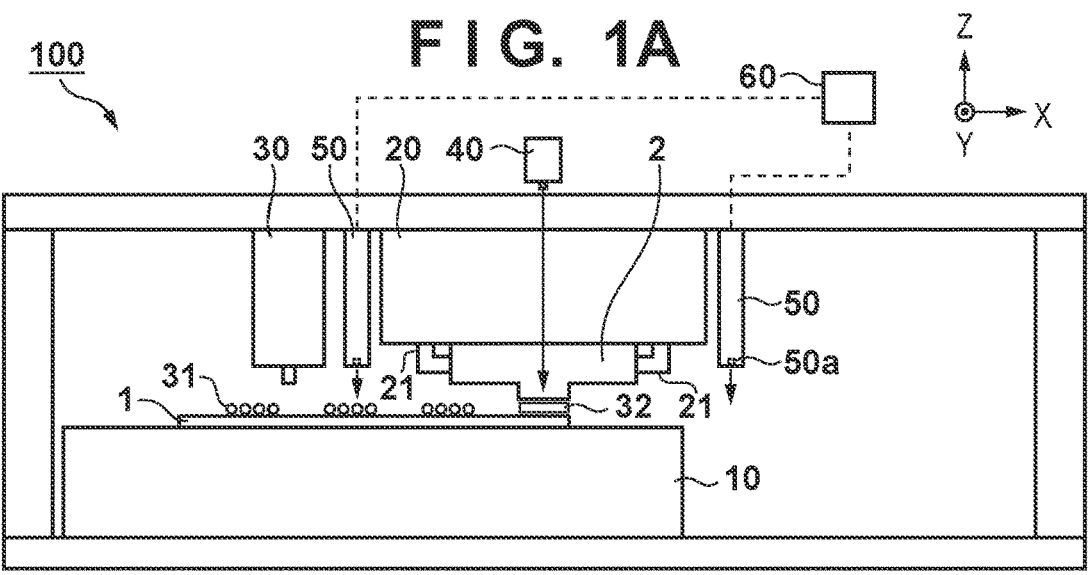
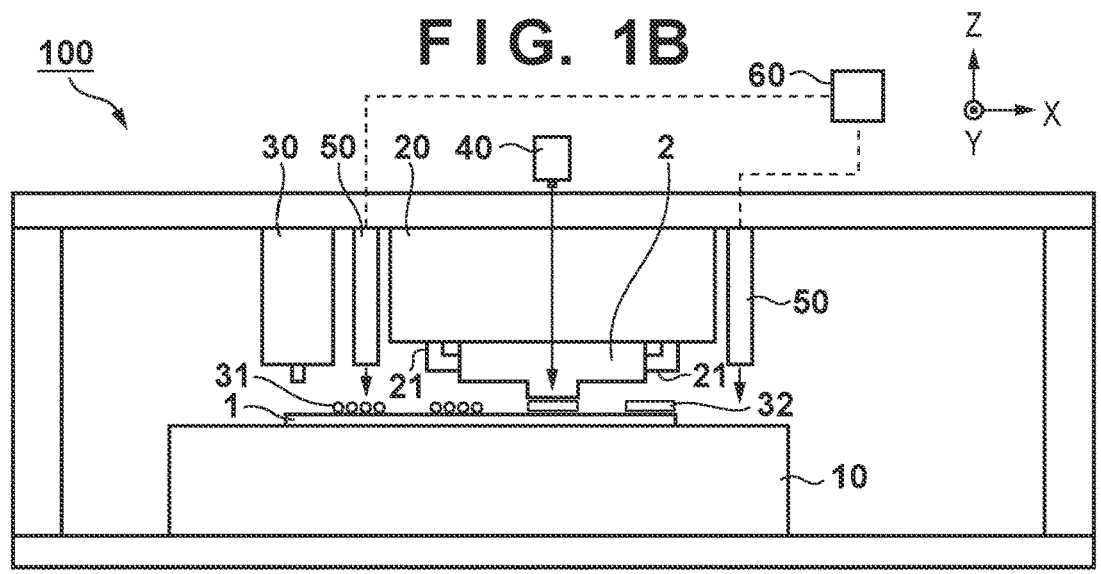
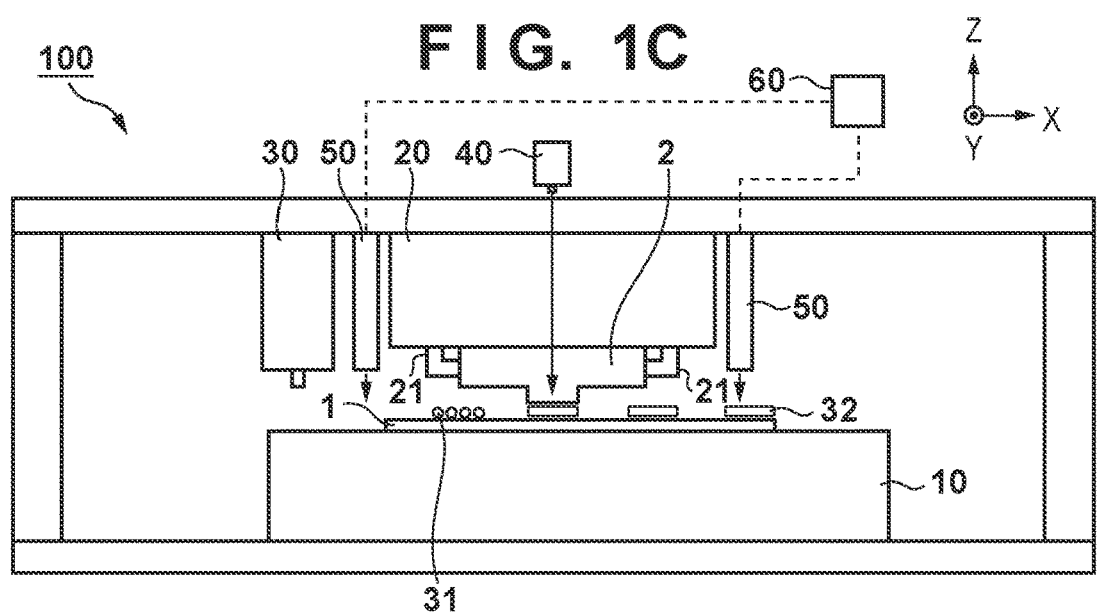

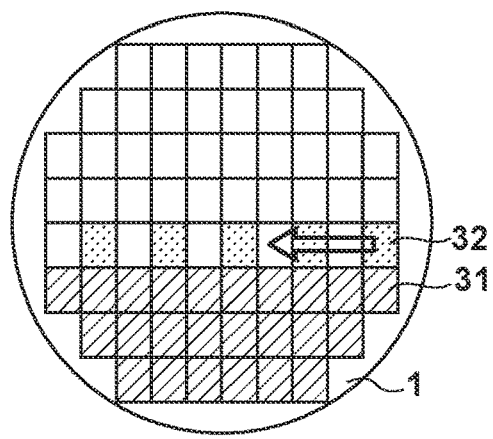
FIG. 2A
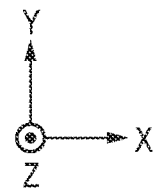
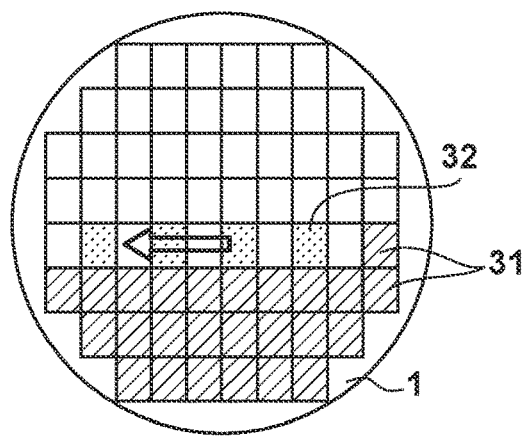
FIG. 2B
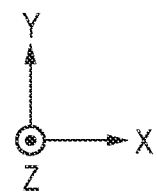
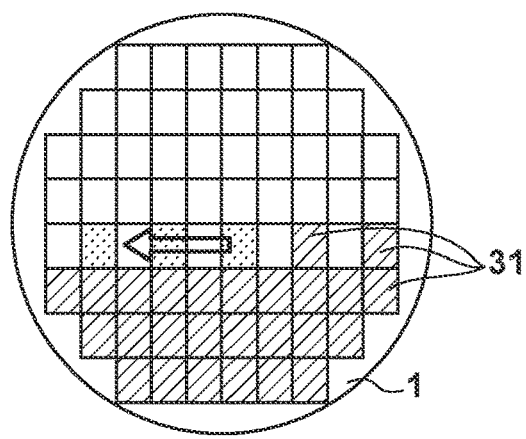
FIG. 2C
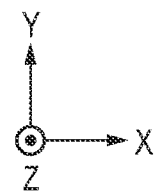
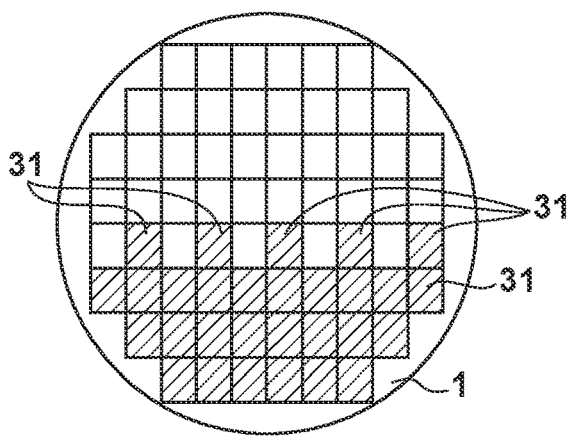
FIG. 2D
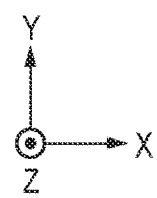

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

Demand for the miniaturization of semiconductor devices is progressing. In addition to conventional photolithography, a nanofabrication technique in which imprint materials on a substrate are formed by forming a nano concave-convex pattern formed in a mold onto a substrate is attracting attention. Such a nanofabrication technique is also referred to as an imprint technique, and it is possible to form a nano pattern (structural body) on the order of nanometers onto a substrate thereby.

One method of curing an imprint material in an imprint technique is a photocuring method. In the photocuring method, an imprint material pattern is formed on a substrate by curing the imprint material by irradiation of light in a state in which the imprint material, after being supplied to a shot region on the substrate, and a mold have been brought into contact with each other, and then releasing the mold from the cured imprint material.

In an imprint apparatus which employs an imprint technique, at a time of a mold contacting an imprint material on a substrate, when a particle exists in the space between the mold and the substrate, the mold or substrate may be damaged or a pattern having a defect may be formed on the substrate. Therefore, by forming an air flow (air curtain) for shielding (surrounding) the space between the mold and the substrate with a gas such as clean, dry air, invasion of a particle into such space is prevented.

The air curtain is generally formed between a position at which the imprint material is supplied on the substrate and a position at which the mold contacts the imprint material on the substrate. For this reason, when the imprint material supplied on the substrate passes through the air curtain, there is a possibility that the imprint material will evaporate. Accordingly, a technique for preventing evaporation of an imprint material on a substrate by reducing the flow amount of gas forming the air curtain when the imprint material on the substrate passes through the air curtain has been proposed in Japanese Patent Laid-Open No. 2016-201485.

Also, there is known a technique for supplying imprint material to multiple shot regions on a substrate at once and performing imprint processing consecutively on such plurality of shot regions as a technique for improving productivity of an imprint apparatus. In such a case, there are cases where, for the shot region on which the imprint processing is performed last, the imprint material evaporates and a desired pattern is not be formed on the substrate because it takes a long time from when the imprint material is supplied until when the imprint processing is performed, for example. Accordingly, a technique for controlling a volume (supply amount) of the imprint material to be supplied on the substrate in accordance with the evaporation time (standby time) from when the imprint material is supplied onto the substrate until when the imprint processing is performed has been proposed in Japanese Patent No. 5084823.

However, in the technique disclosed in Japanese Patent Laid-Open No. 2016-201485, the following problem arises in a case where imprint processing is consecutively performed on a plurality of shot regions on the substrate on which the imprint material is supplied. For example, while imprint processing is being performed on a shot region, uncured imprint material that has been supplied to another shot region is exposed to the air curtain and locally evaporates. Note, whether the uncured imprint material is exposed to the air curtain and the time over which uncured imprint material is exposed to the air curtain depend on the order of the imprint processing, size of the shot region, position of the shot region on which the imprint material is supplied, and the like. Also, even with the technique disclosed in Japanese Patent No. 5084823, a similar problem will occur in the case in which the air curtain for shielding the space between the mold and the substrate is formed.

SUMMARY OF THE INVENTION

The present invention provides an imprint apparatus that is advantageous for suppressing the evaporation of the imprint material and forming a pattern of the imprint material.

According to one aspect of the present invention, there is provided an imprint apparatus for performing imprint processing of forming a pattern of an imprint material on a substrate by using a mold, the imprint apparatus including a forming unit including an outlet configured to blow out a gas towards the substrate side from the mold side and configured to form, by the gas, an air flow that surrounds a space between the mold and the substrate, and a control unit configured to control the forming unit when the imprint processing is consecutively performed on a plurality of shot regions on the substrate after an uncured imprint material has been supplied thereto, wherein the control unit, in a case where in the imprint processing, there is an uncured imprint material under the outlet in a state in which at least one shot region among the plurality of shot regions and the mold face each other, controls the forming unit such that a flow amount of the gas blown out from the outlet becomes a second flow amount which is less than a first flow amount of the gas blown out from the outlet in a case where there is no uncured imprint material under the outlet.

Further features of the present invention will become apparent from the following description of exemplary embodiments (with reference to the attached drawings).

BRIEF DESCRIPTION OF THE DRAWINGS

FIG. 1A to FIG. 1C are schematic views illustrating configurations of an imprint apparatus as one aspect of the present invention.

FIG. 2A to FIG. 2D are views for describing an order of imprint processing.

DESCRIPTION OF THE EMBODIMENTS

Figure 3A:
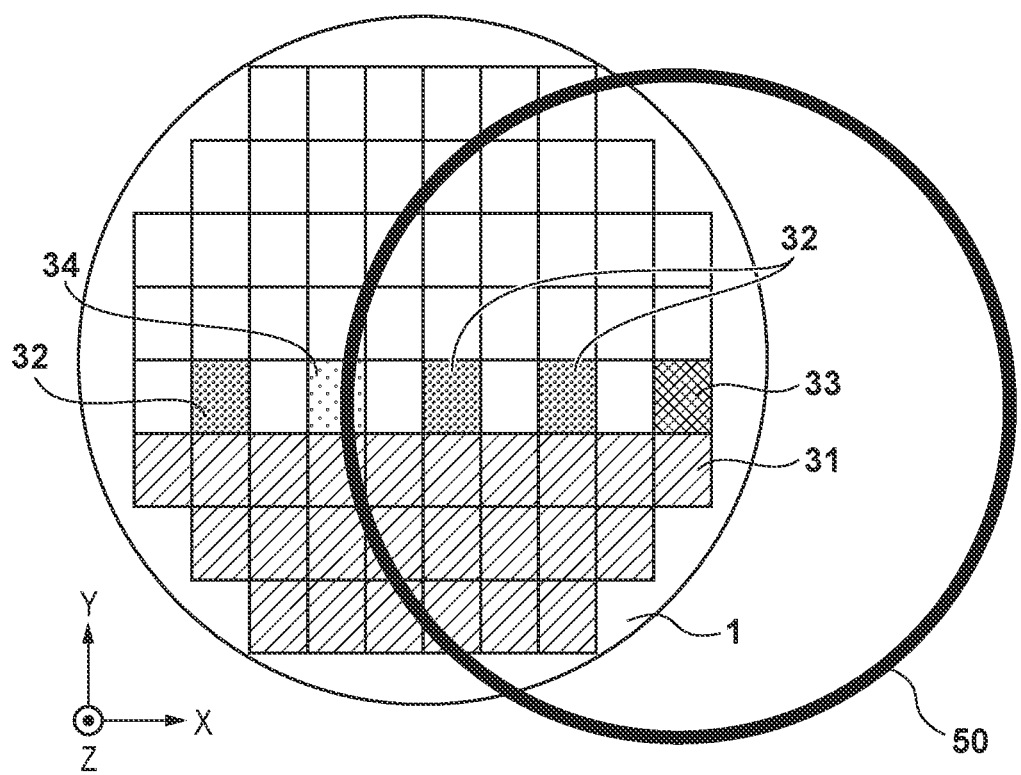
FIG. 3A and FIG. 3B are views illustrating a positional relationship between a shot region on a substrate and a forming unit.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1A, FIG. 1B, and FIG. 1C are schematic views illustrating configurations of an imprint apparatus 100 as one aspect of the present invention. The imprint apparatus 100 is a lithography apparatus that performs imprint processing for forming a pattern of an imprint material onto a substrate by using a mold. The imprint apparatus 100 brings a mold into contact with an uncured imprint material supplied (arranged) onto a substrate and applies curing energy to the imprint material, thereby forming a pattern of a cured product to which a pattern of the mold has been transferred.

As the imprint material, a curable composition (to be also referred to as a resin in an uncured state) to be cured by receiving curing energy is used. An example of the curing energy that is used is electromagnetic waves and the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater (spin coating method) or a slit coater (slit coating method). The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated by an XYZ coordinate system in which directions parallel to the surface of a substrate 1 are set as the X-Y plane. Directions parallel to the X-axis, the Y-axis, and the Z-axis of the XYZ coordinate system are the X direction, the Y direction, and the Z direction, respectively, and a rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that is specified based on coordinates on the X-, Y-, and Z-axes, and an orientation is information that is specified by values on the θX-, θY-, and θZ-axes. Positioning means controlling the position and/or orientation.

The imprint apparatus 100 includes a substrate stage 10 which holds and moves the substrate 1, a head 20 which holds and moves a mold 2, and a supply unit 30 which supplies an uncured imprint material onto the (plurality of shot regions of the) substrate. Also, the imprint apparatus 100 includes a shape correction unit 21, an irradiation unit 40, a forming unit 50, and a control unit 60.

The substrate stage 10 and the head 20 form a relative movement mechanism that moves at least one of the substrate 1 and the mold 2 so as to adjust the relative position between the substrate 1 and the mold 2. Adjustment of the relative position between the substrate 1 and the mold 2 by the relative movement mechanism includes driving to bring the imprint material on the substrate into contact (press) with the mold 2 and driving to separate (release) the mold 2 from the cured imprint material on the substrate 1. In addition, adjustment of the relative position between the substrate 1 and the mold 2 by the relative movement mechanism includes positioning between the substrate 1 and the mold 2. The substrate stage 10 is configured to drive the substrate 1 with respect to a plurality of axes (for example, three axes including the X-axis, Y-axis, and θZ-axis, and preferably six axes including the X-axis, Y-axis, Z-axis, θX-axis, θY-axis, and θZ-axis). The head 20 is configured to drive the mold 2 with respect to a plurality of axes (for example, three axes including the X-axis, Y-axis, and θZ-axis, and preferably six axes including the X-axis, Y-axis, Z-axis, θX-axis, θY-axis, and θZ-axis).

The supply unit 30 includes a dispenser for discharging imprint material onto each shot region on the substrate, for example. In the supply unit 30, the imprint material is supplied via a pipe (not shown) from a tank (not shown) in which the imprint material is stored. The imprint material not supplied onto the substrate from the supply unit 30 is recovered to the tank via the pipe. Also, the supply unit 30 may also be a cartridge type in which a tank in which the imprint material is stored and a nozzle that discharges the imprint material onto the substrate are integrated.

The shape correction unit 21 has a function for correcting the scale (shape) of the mold 2 held by the head 20. The shape correction unit 21 includes, for example, a plurality of fingers that deform the mold 2 by applying (pressurizing) a force to the side surface of the mold 2 in a direction parallel to a pattern surface (surface on which the pattern is formed) of the mold 2.

When the imprint material on the substrate is to be cured, the irradiation unit 40 irradiates light onto the imprint material via the mold 2, in other words, in a state in which the imprint material on the substrate and the mold 2 have been brought into contact. The irradiation unit 40 includes, for example, a light source (not shown) and an optical system (not shown) that adjusts the light from such a light source to a light suitable for curing the imprint material.

The forming unit 50 includes an outlet 50a which blows out (supplies) gas from the mold 2 side toward (in other words, in the −Z direction) the substrate 1 side and forms an air flow, a so-called air curtain which surrounds the space between the mold 2 and the substrate 1, by the gas blown out from the outlet 50a. The gas blown out from the outlet 50a may be, for example, clean, dry air or the like.

The control unit 60 is configured by an information processing apparatus (computer) including a CPU, memory, and the like, and operates the imprint apparatus 100 by comprehensively controlling each unit of the imprint apparatus 100 in accordance with a program stored in a storage unit. The control unit 60 controls the imprint processing and processing relating to the imprint processing. Also, in the present embodiment, the control unit 60 controls the forming unit 50, specifically, the flow amount of the gas blown out from the outlet 50a when consecutively performing imprint processing on a plurality of shot regions on the substrate on which uncured imprint material is supplied.

Description is given regarding the imprint processing in the imprint apparatus 100. Firstly, while the substrate stage 10 holding the substrate 1 is reciprocally moved under the supply unit 30 (imprint material supply position), the imprint material is discharged from the supply unit 30 according to the drop recipe and the uncured imprint material is supplied to the shot region on the substrate. In the present embodiment, the supply unit 30 supplies the uncured imprint material to a plurality of shot regions (at least two shot regions) on the substrate at one time. Hereinafter, the shot region to which the uncured imprint material is supplied and the imprint processing is performed will be referred to as a target shot region. Hereinafter, the shot region is a region corresponding to a pattern region (region on which the pattern is formed) of the mold 2.

When the uncured imprint material is supplied to a plurality of shot regions on the substrate, the substrate stage 10 which holds the substrate 1 is moved under (imprint position) the mold 2 held by the head 20. When the target shot region on the substrate is positioned at the imprint position, processing for bringing the uncured imprint material supplied to the target shot region and the mold 2 into contact is started. At this time, the control unit 60 determines whether or not uncured imprint material is present under the outlet 50a in a state in which the target shot region (at least one shot region) and the mold 2 face each other (whether or not the outlet 50a is positioned above the uncured imprint material). In a case where uncured imprint material is present under the outlet 50a, the control unit 60 controls the forming unit 50 so as to reduce the flow amount of gas blown out from the outlet 50a. For example, the forming unit 50 is controlled such that the flow amount of the gas blown out from the outlet 50a is a flow amount (second flow amount) smaller than the flow amount (first flow amount) of the gas blown out from the outlet 50a in a case where uncured imprint material is not present under the outlet 50a. Note, in a case where the imprint material has a high volatility, the substrate stage 10 may be stopped and the flow amount of the gas blown out from the outlet 50a may be set to zero at a point in time when the head 20 starts movement for bringing the uncured imprint material on the substrate and the mold 2 into contact. Also, the control unit 60 controls the forming unit 50 so that the flow amount of the gas blown out from the outlet 50a during movement of the substrate 1 is smaller than the flow amount of the gas blown out from the outlet 50a while the substrate 1 is stationary.

When the uncured imprint material supplied to the target shot region and the mold 2 are brought into contact, the shape of the mold 2 may be corrected by the shape correction unit 21 so that the (pattern of the) mold 2 becomes a predetermined shape. When the uncured imprint material supplied to the target shot region and the mold 2 are brought into contact, light is irradiated from the irradiation unit 40 in such a state and the imprint material is cured via the mold 2. Next, the mold 2 is released from the imprint material cured on the target shot region. By this, the pattern of the imprint material is formed on the target shot region.

When the mold 2 is released from the imprint material, the substrate stage 10 which holds the substrate 1 is caused to move under the mold 2 and the next target shot region on the substrate is positioned at the imprint position. When the next target shot region on the substrate is positioned at the imprint position, processing for bringing the uncured imprint material supplied to the next target shot region and the mold 2 into contact is started. At this time, the control unit 60 redetermines whether or not uncured imprint material is present under the outlet 50a in a state in which the next target shot region and the mold 2 face each other. In a case where uncured imprint material is present under the outlet 50a, the control unit 60 maintains the flow amount of gas blown out from the outlet 50a by the second flow amount. Meanwhile, in a case where uncured imprint material is not present under the outlet 50a, the control unit 60 returns the flow amount of the gas blown out from the outlet 50a from the second flow amount to the first flow amount.

Such a series of operations is repeated until the imprint processing is performed on all of the plurality of shot regions on which uncured imprint material is supplied at once from the supply unit 30. Also, when the imprint processing on all shot regions on the substrate ends, the substrate 1 is unloaded from the imprint apparatus 100.

FIG. 2A, FIG. 2B, FIG. 2C, and FIG. 2D are views for describing an order of the imprint processing in the imprint apparatus 100 and illustrate situations in which the imprint processing is consecutively performed on a plurality of shot regions on the substrate. In the present embodiment, as illustrated in FIG. 2A, the supply unit 30 cooperates with the substrate stage 10 and supplies uncured imprint material at once to a plurality of shot regions 32 on the substrate. The shot region 32 is a shot region on which uncured imprint material is supplied from among the shot regions on the substrate. Also, in FIG. 2A, a shot region 31 indicates a shot region on which a pattern of the imprint material is formed through imprint processing.

In the present embodiment, as illustrated in FIG. 2B, FIG. 2C, and FIG. 2D, imprint processing is consecutively performed until the pattern of the imprint material is formed on every shot region 32 on the substrate (in other words, until the shot region 32 becomes the shot region 31). From the viewpoint of the productivity of the apparatus, the imprint processing is preferably performed in order from the shot regions at the edges in relation to the shot regions included in one column, but the order of the imprint processing is not limited. For example, as illustrated in FIG. 2A to FIG. 2D, imprint processing may be consecutively performed while skipping one shot region.

Figure 3B:
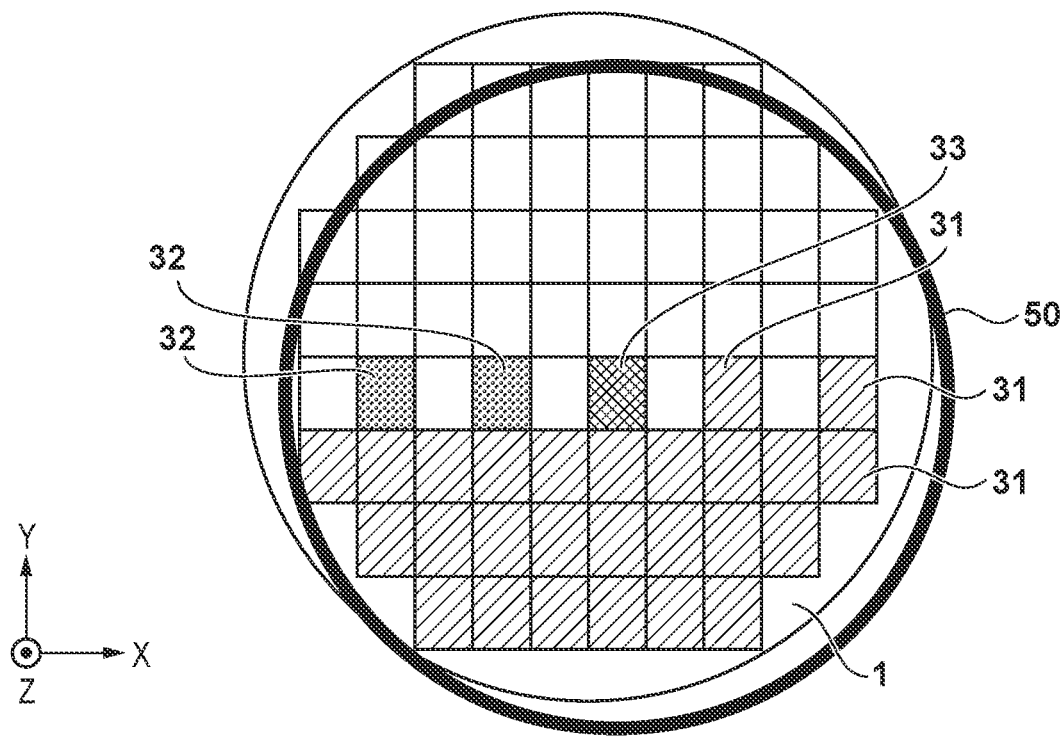

FIG. 3A and FIG. 3B are views illustrating a positional relationship between a shot region on the substrate and the forming unit 50 in the imprint processing of the present embodiment. As illustrated in FIG. 3A and FIG. 3B, the forming unit 50 has a ring shape so as to surround the mold 2 held in the head 20 and outlets 50a are arranged across this circumference. Also, a shot region 33 indicates the target shot region on which the imprint processing is to be performed, and a shot region 34 indicates a shot region in which the gas blown out from the outlet 50a directly hits the uncured imprint material.

With reference to FIG. 3A, the gas blown out from the outlet 50a directly hits the uncured imprint material supplied to the shot region 34 in a state in which the target shot region 33 of the substrate 1 and the mold 2 face each other. In such a case, as described above, the control unit 60 controls the forming unit 50 such that the flow amount of the gas blown out from the outlet 50a is reduced and such a flow amount becomes the second flow amount. By this, it is possible to prevent evaporation of uncured imprint material supplied to the shot region 34. Note, as a guide for reducing the flow amount of the gas blown from the outlet 50a, configuration may be taken such that flow velocity at a time when the gas blown out from the outlet 50a reaches the uncured imprint material becomes slower than the velocity at which the substrate stage 10 moves while holding the substrate 1. However, such a guide is not limited to this because it depends on the volatility of the imprint material supplied onto the substrate.

Also, as the imprint processing proceeds, with reference to FIG. 3B, a shot region onto which the gas blown out from the outlet 50a directly hits the uncured imprint material is not present in a state in which the target shot region 33 close to the center of the substrate 1 and the mold 2 face each other. In such a case, as described above, the control unit 60 controls the forming unit 50 such that the flow amount of the gas blown out from the outlet 50a returns from the second flow amount to the first flow amount. By returning the flow amount of the gas blown out from the outlet 50a to the first flow amount, because it is possible to form an air curtain that surrounds the space between the mold 2 and the substrate 1 by a sufficient flow amount, it is possible to prevent invasion of a particle to such a space.

Also, there is also a case such as the imprint processing being started from the target shot region 33 near the center of the substrate 1, for example. In such a case, as described above, the control unit 60 controls the forming unit 50 such that, because it is not necessary to reduce the flow amount of the gas blown out from the outlet 50a, such flow amount is maintained by the first flow amount.

In FIG. 3A and FIG. 3B, the forming unit 50 has a ring shape, and although description is given regarding a case where the outlets 50a are arranged across this circumference, limitation is not made to this. For example, a plurality of the outlets 50a may be arrange along the circumference of the forming unit 50 having a ring shape. In such a case, the control unit 60 controls the forming unit 50 such that the flow amount of the gas blown out from each outlet 50a is individually adjusted based on the positional relationship between each of the plurality of the outlets 50a and uncured imprint material supplied on the plurality of shot regions on the substrate. For example, the control unit 60 controls the forming unit 50 such that the flow amount of the gas blown out from the outlet 50a under which uncured imprint material is present becomes smaller than the flow amount of the gas blown out from the outlet 50a under which uncured imprint material is not present. More specifically, configuration is taken such that the flow amount of the gas blown out from the outlet 50a under which uncured imprint material is present becomes the second flow amount and the flow amount of the gas blown out from the outlet 50a under which uncured imprint material is not present becomes the first flow amount.

Figure 4A:
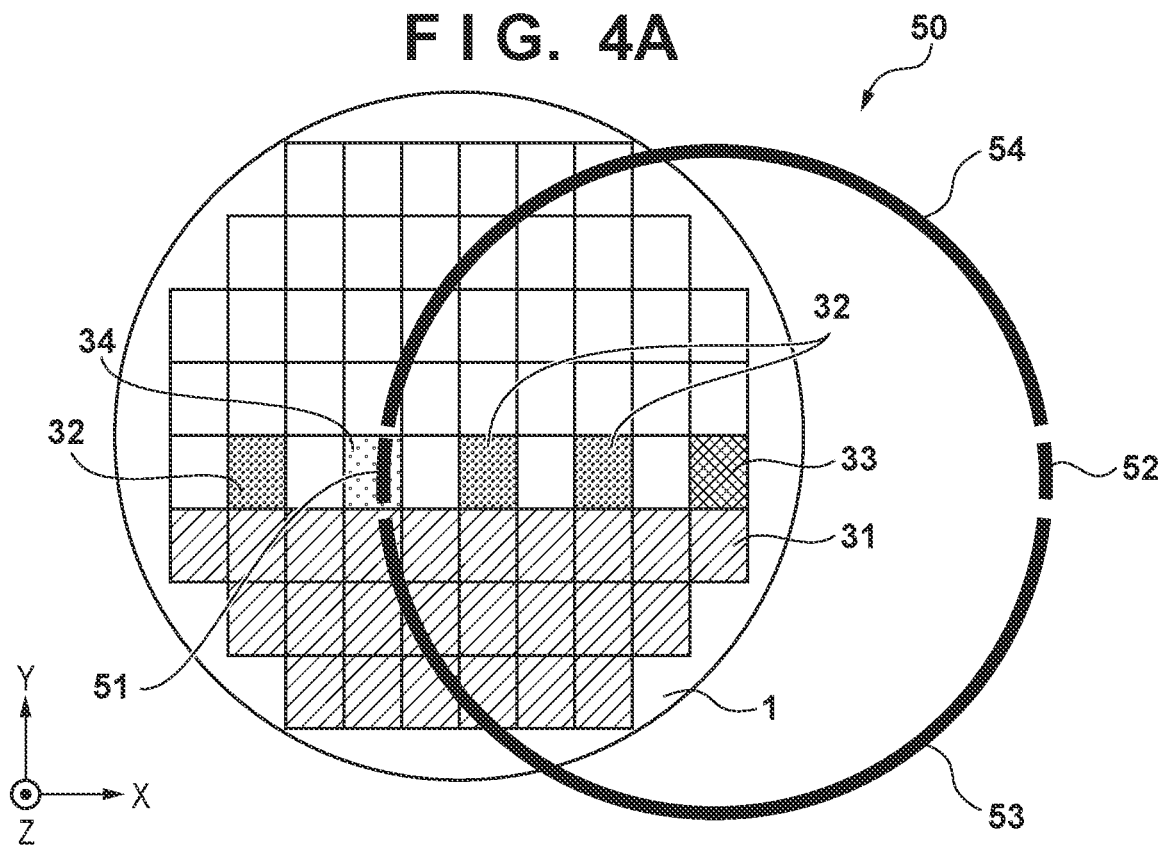
FIG. 4A and FIG. 4B are views illustrating a positional relationship between a shot region on a substrate and a forming unit.
Figure 4B:
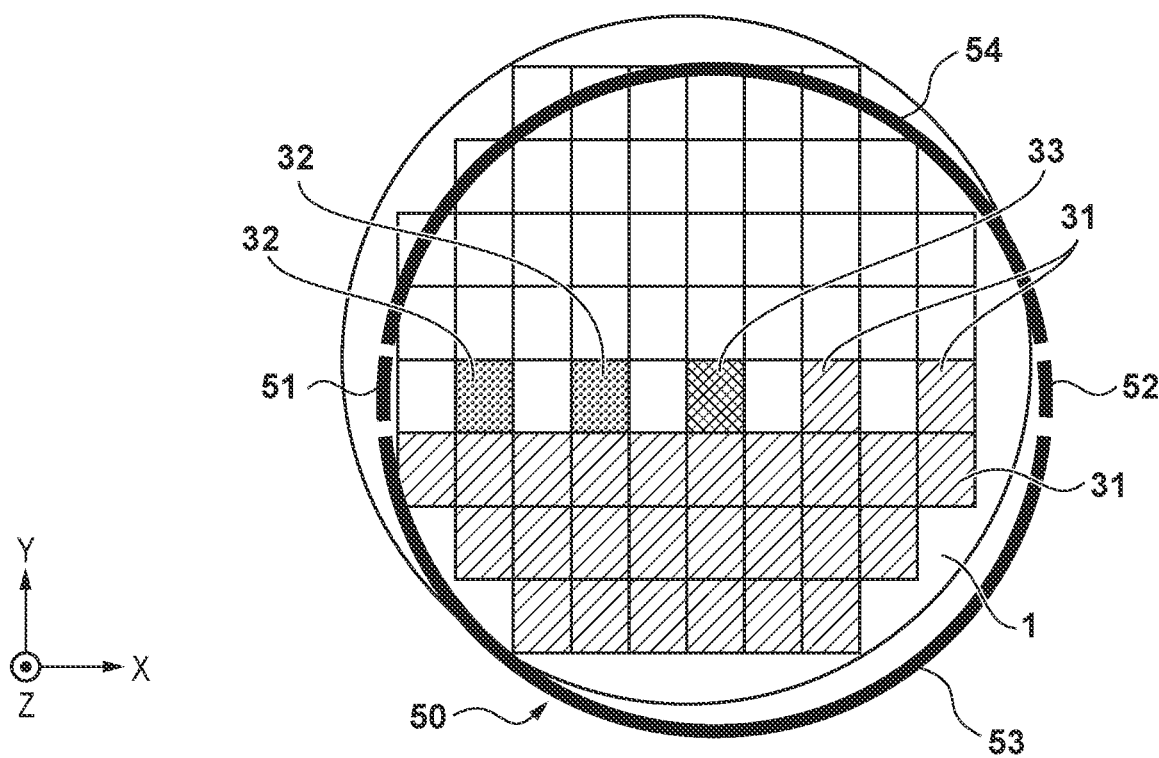

Also, the forming unit 50 may be divided and arranged so as to surround the mold 2 held in the head 20. For example, as illustrated in FIG. 4A and FIG. 4B, the forming unit 50 includes a plurality of forming units independent of each other, specifically, includes a first forming unit 51, a second forming unit 52, a third forming unit 53, and a fourth forming unit 54. The first forming unit 51 and the second forming unit 52 are arranged with the mold 2 therebetween. Similarly, the third forming unit 53 and the fourth forming unit 54 are arranged with the mold 2 therebetween. The outlet 50a is formed in each of the first forming unit 51, the second forming unit 52, the third forming unit 53, and the fourth forming unit 54. Also, the control unit 60 can individually control the flow amount of gas blown out from the outlet 50a of the first forming unit 51, the second forming unit 52, the third forming unit 53, and the fourth forming unit 54, respectively. Note, the number of divisions of the forming unit 50 (division number) or the positions at which the forming unit 50 is divided (divided positions) are not limited to the examples shown in FIG. 4A and FIG. 4B. For example, the division number or the divided positions of the forming unit 50 may be decided in accordance with the layout of the shot regions on the substrate, the order of imprint processing, or the like.

With reference to FIG. 4A, the gas blown out from the outlet 50a of the first forming unit 51 directly hits the uncured imprint material supplied to the shot region 34 in a state in which the target shot region 33 of the edge of the substrate 1 and the mold 2 face each other. In such a case, as described above, the control unit 60 controls the forming unit 50 such that the flow amount of the gas blown out from the outlet 50a of the first forming unit 51 is reduced and such flow amount becomes the second flow amount. By this, it is possible to prevent evaporation of the uncured imprint material supplied to the shot region 34 existing under the outlet 50a of the first forming unit 51. Also, regarding each of the second forming unit 52, the third forming unit 53, because uncured imprint material under these is not present, and the fourth forming unit 54, the control unit 60 sets the flow amount of the gas blown out from the outlet 50a to the first flow amount.

Additionally, progressing to the imprint processing, with reference to FIG. 4B, uncured imprint material is not present under the first forming unit 51, the second forming unit 52, the third forming unit 53, and the fourth forming unit 54 in a state in which the target shot region 33 near the center of the substrate 1 faces the mold 2. In other words, the shot region on which the gas blown out from the outlet 50a of the first forming unit 51, the second forming unit 52, the third forming unit 53, and the fourth forming unit 54 each directly hits the uncured imprint material is not present. In such a case, as described above, the control unit 60 controls the forming unit 50 such that the flow amount of the gas blown out from the outlet 50a of the first forming unit 51 returns from the second flow amount to the first flow amount. By returning the flow amount of the gas blown out from the outlet 50a of the first forming unit 51 to the first flow amount, because it is possible to form an air curtain that surrounds the space between the mold 2 and the substrate 1 by a sufficient flow amount, it is possible to prevent invasion of a particle to such a space. Note that the flow amount of the gas blown out from the outlet 50a of the second forming unit 52, the third forming unit 53, and the fourth forming unit 54 respectively is maintained as the first flow amount.

As described above, it is possible to adjust the flow amount of the gas for each forming unit while having a simple configuration by dividing the forming unit 50 so as to surround the mold 2 held in the head 20. Therefore, control when forming the air curtain surrounding the space between the mold 2 and the substrate 1 is simplified.

Figure 5:
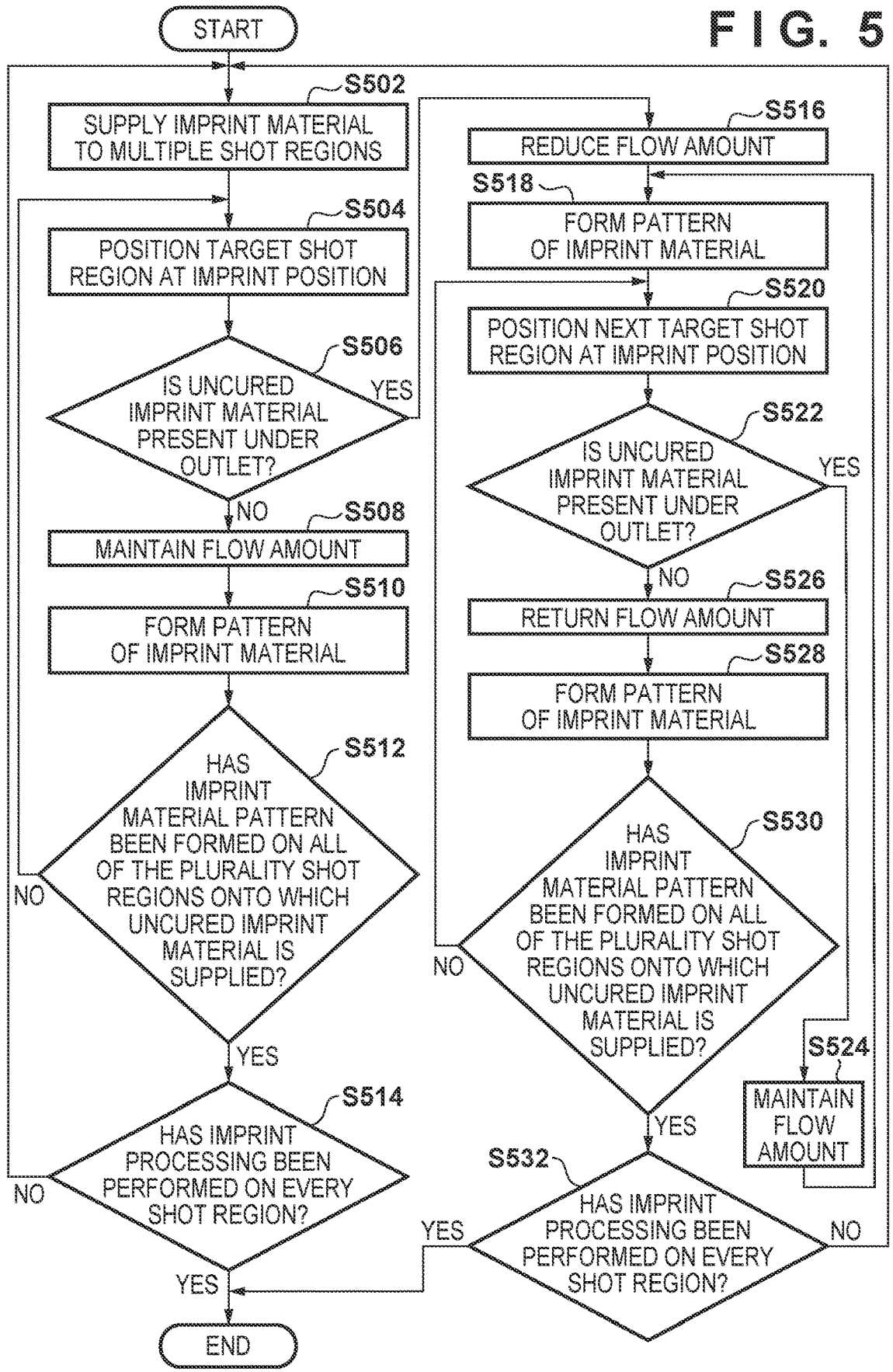
FIG. 5 is a flowchart for describing a sequence of the imprint processing.

With reference to FIG. 5, description of a sequence of the imprint processing in the imprint apparatus 100 is given.

Here, it is assumed that the forming unit 50 blows out gas from the outlet 50a before starting the imprint processing, and sets the flow amount as the first flow amount.

In step S502, uncured imprint material from the supply unit 30 is supplied at once to the plurality of shot regions 32 on the substrate. In step S504, the substrate stage 10 is moved toward the bottom of the mold 2, and the target shot region from among the plurality of shot regions to which the uncured imprint material has been supplied is positioned at the imprint position. At this time, when uncured imprint material supplied onto the substrate passing through the bottom of the forming unit 50 (the outlet 50a), the flow amount of gas blown out from the outlet 50a may be reduced from the first flow amount. By this, it is possible to prevent evaporation of uncured imprint material supplied onto the substrate.

In step S506, it is determined whether or not uncured imprint material is present under the outlet 50a of the forming unit 50 in a state in which the target shot region faces the mold 2. In a case where the uncured imprint material is present under the outlet 50a, the processing advances to step S508. On the other hand, in a case where the uncured imprint material is present under the outlet 50a, the processing advances to step S516.

In step S508, because the shot region on which the gas blown out from the outlet 50a of the forming unit 50 directly hits the uncured imprint material is not present, the flow amount of the gas blown out from the outlet 50a is not changed and is maintained as the first flow amount.

In step S510, a pattern of the imprint material is formed on the target shot region. More specifically, as described above, the uncured imprint material supplied to the target shot region and the mold 2 are brought into contact, light is irradiated from the irradiation unit 40 in such a state, and the imprint material is cured via the mold 2. Then, by releasing the mold 2 from the imprint material cured on the target shot region, a pattern of the imprint material is formed on the target shot region.

In step S512, it is determined whether or not the pattern of the imprint material has been formed on all of the plurality of shot regions on which uncured imprint material had been supplied in step S502. In a case where a pattern of the imprint material is not being formed on all of the plurality of shot regions on which the uncured imprint material was supplied, the processing transitions to step S504 in order to form a pattern of the imprint material onto a next target shot region. Meanwhile, in a case where a pattern of the imprint material has been formed on all of the plurality of shot regions on which the uncured imprint material had been supplied, the processing transitions to step S514.

In step S514, it is determined whether or not the imprint processing has been performed on all of the shot regions on the substrate. In a case where the imprint processing has been performed on all of the shot regions on the substrate, the substrate 1 is unloaded from the imprint apparatus 100 and the imprint processing ends. On the other hand, in a case where the imprint processing is not being performed on all of the shot regions on the substrate, the processing transitions to step S502 in order to supply uncured imprint material to the plurality of shot regions on which imprint processing has not been performed.

In step S516, because the shot region on which the gas blown out from the outlet 50a of the forming unit 50 directly hits the uncured imprint material is present, the flow amount of the gas blown out from the outlet 50a is reduced and is set from the first flow amount to the second flow amount.

In step S518, similarly to step S510, a pattern of the imprint material is formed on the target shot region.

In step S520, in order to form the pattern of the imprint material on a next target shot region, the substrate stage 10 moves toward the bottom of the mold 2, and the next target shot region is positioned at the imprint position.

In step S522, it is determined whether or not uncured imprint material is present under the outlet 50a of the forming unit 50 in a state in which the next target shot region faces the mold 2. In a case where the uncured imprint material is present under the outlet 50a, the processing advances to step S524. On the other hand, in a case where the uncured imprint material is present under the outlet 50a, the processing advances to step S526.

In step S524, because a shot region on which the gas blown out from the outlet 50a of the forming unit 50 directly hits an uncured imprint material is present, the flow amount of the gas blown out from the outlet 50a is not changed and is maintained as the second flow amount.

In step S526, because a shot region on which the gas blown out from the outlet 50a of the forming unit 50 directly hits an uncured imprint material is not present, the flow amount of the gas blown out from the outlet 50a is increased to returned it from the second flow amount to the first flow amount.

In step S528, similarly to step S510, a pattern of the imprint material is formed on the next target shot region.

In step S530, it is determined whether or not the pattern of the imprint material has been formed on all of the plurality of shot regions on which uncured imprint material had been supplied in step S502. In a case where a pattern of the imprint material is not being formed on all of the plurality of shot regions on which the uncured imprint material was supplied, the processing transitions to step S520 in order to form a pattern of the imprint material onto a next target shot region. Meanwhile, in a case where a pattern of the imprint material has been formed on all of the plurality of shot regions on which the uncured imprint material had been supplied, the processing transitions to step S532.

In step S532, it is determined whether or not the imprint processing has been performed on all of the shot regions on the substrate. In a case where the imprint processing has been performed on all of the shot regions on the substrate, the substrate 1 is unloaded from the imprint apparatus 100 and the imprint processing ends. On the other hand, in a case where the imprint processing has not been performed on all of the shot regions on the substrate, the processing transitions to step S502 in order to supply uncured imprint material to the plurality of shot regions on which imprint processing has not been performed.

By virtue of the imprint processing in the imprint apparatus 100 of the present embodiment, it is possible to prevent the gas (air curtain) blown out from the outlet 50a of the forming unit 50 from hitting (flow amount) uncured imprint material supplied on the substrate. Therefore, in the imprint apparatus 100, it is possible to prevent evaporation of uncured imprint material supplied on the substrate and to form with high accuracy a pattern of the imprint material on the substrate.

Figure 6A:
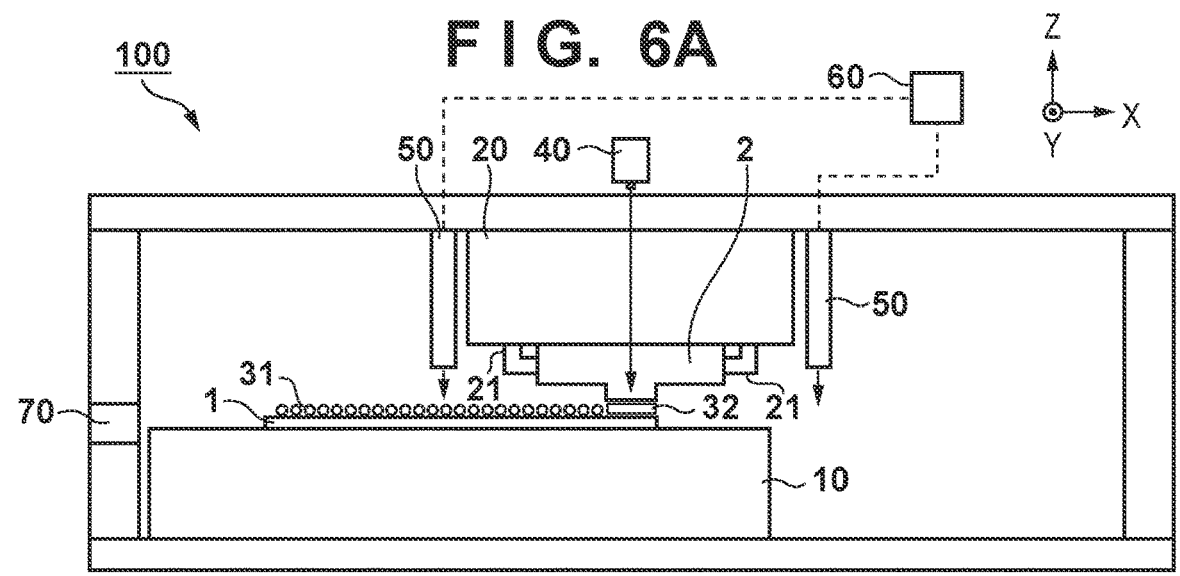
FIG. 6A to FIG. 6C are schematic views illustrating configurations of the imprint apparatus as one aspect of the present invention.
Figure 6B:
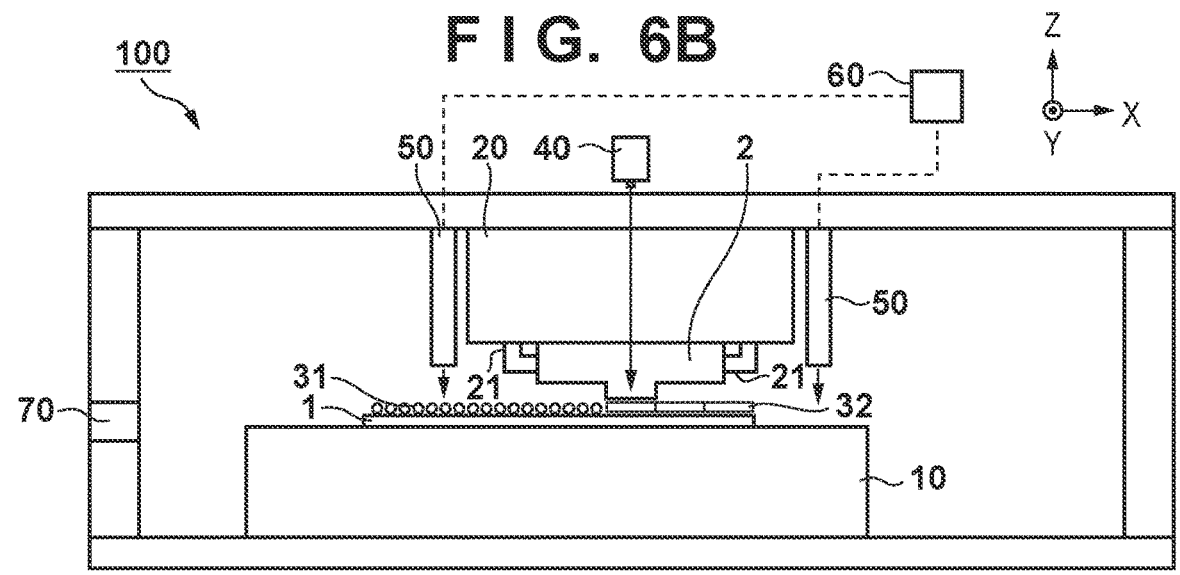
Figure 6C:
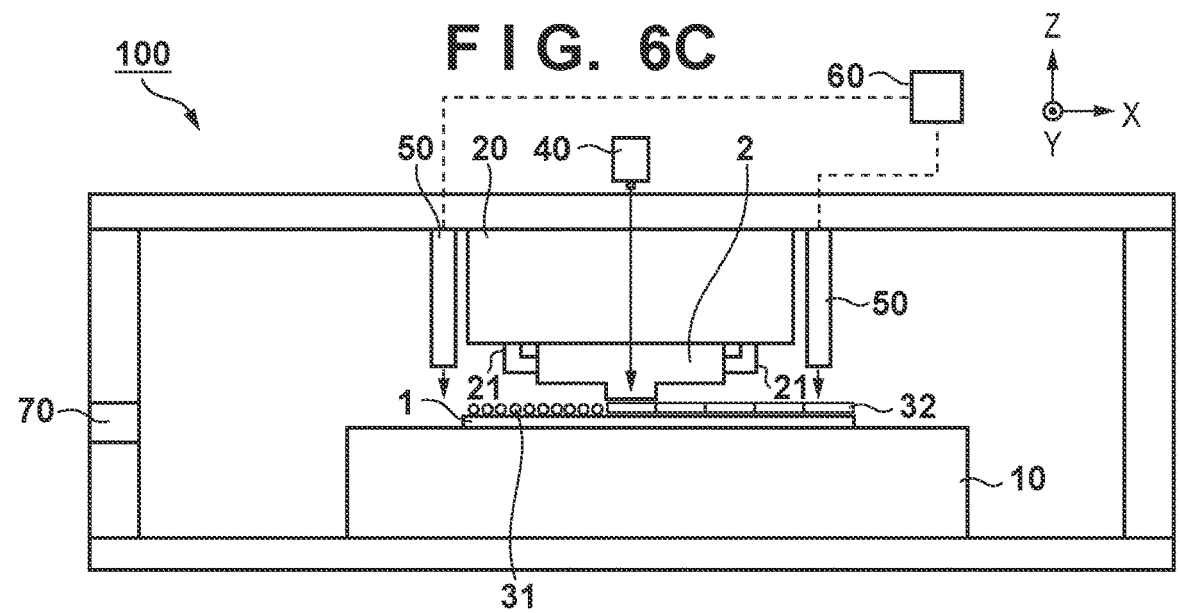

Note, the imprint apparatus 100 may not have the supply unit 30 which supplies the uncured imprint material onto a plurality of shot regions on the substrate as illustrated in FIG. 6A, FIG. 6B, and FIG. 6C. In other words, the uncured imprint material may be supplied to a plurality of shot regions on the substrate by an external apparatus such as a coater developer, for example. In such a case, the imprint apparatus 100 has a loading unit 70 for loading the substrate 1 on which uncured imprint material was supplied to a plurality of shot regions. The loading unit 70, for example, includes a loading port for loading the substrate 1 on which uncured imprint material is supplied to the imprint apparatus 100, a delivery mechanism (conveyance mechanism) which receives the substrate 1 loaded from the loading port and transfers it to the substrate stage 10, or the like.

Figure 7:
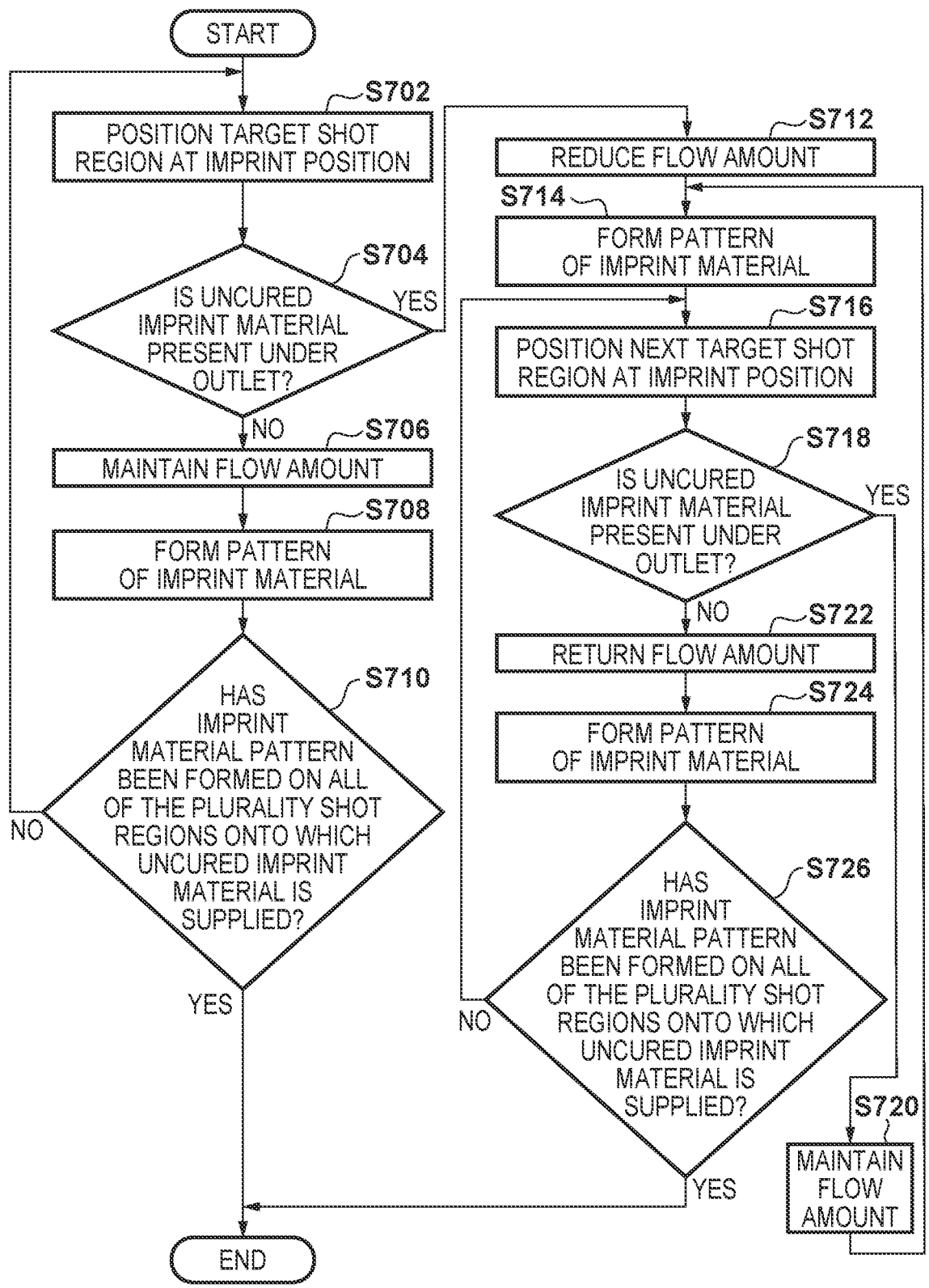
FIG. 7 is a flowchart for describing a sequence of the imprint processing.

With reference to FIG. 7, description of a sequence of the imprint processing in the imprint apparatus 100 shown in FIG. 6A to FIG. 6C is given. Here, it is assumed that the substrate 1 on which uncured imprint material is supplied to a plurality of shot regions is loaded into the imprint apparatus 100 via the loading unit 70 and held in the substrate stage 10. Here, it is assumed that the forming unit 50 blows out gas from the outlet 50a before starting the imprint processing, and sets the flow amount as the first flow amount.

In step S702, the substrate stage 10 is moved toward the bottom of the mold 2, and the target shot region from among the plurality of shot regions to which the uncured imprint material has been supplied is positioned at the imprint position. At this time, when uncured imprint material supplied onto the substrate passing through the bottom of the forming unit 50, the flow amount of gas blown out from the outlet 50a may be reduced from the first flow amount. By this, it is possible to prevent evaporation of uncured imprint material supplied onto the substrate.

In step S704, it is determined whether or not uncured imprint material is present under the outlet 50a of the forming unit 50 in a state in which the target shot region faces the mold 2. In a case where the uncured imprint material is present under the outlet 50a, the processing advances to step S706. On the other hand, in a case where the uncured imprint material is present under the outlet 50a, the processing advances to step S712.

In step S706, because the shot region on which the gas blown out from the outlet 50a of the forming unit 50 directly hits the uncured imprint material is not present, the flow amount of the gas blown out from the outlet 50a is not changed and is maintained as the first flow amount.

In step S708, a pattern of the imprint material is formed on the target shot region. Detailed description is omitted here because specific processing is the same as step S510.

In step S710, it is determined whether or not the pattern of the imprint material has been formed on all of the plurality of shot regions on which uncured imprint material was supplied. In a case where a pattern of the imprint material has not been formed on all of the plurality of shot regions on which the uncured imprint material was supplied, the processing transitions to step S702 in order to form a pattern of the imprint material onto a next target shot region. Meanwhile, in a case where a pattern of the imprint material has been formed on all of the plurality of shot regions on which the uncured imprint material was supplied, the substrate 1 is unloaded from the imprint apparatus 100 and the imprint processing ends.

In step S712, because the shot region on which the gas blown out from the outlet 50a of the forming unit 50 directly hits the uncured imprint material is present, the flow amount of the gas blown out from the outlet 50a is reduced and is set from the first flow amount to the second flow amount.

In step S714, similarly to step S708, a pattern of the imprint material is formed on the target shot region.

In step S716, in order to form the pattern of the imprint material on a next target shot region, the substrate stage 10 moves toward the bottom of the mold 2, the next target shot region is positioned at the imprint position.

In step S718, it is determined whether or not uncured imprint material is present under the outlet 50a of the forming unit 50 in a state in which the next target shot region faces the mold 2. In a case where the uncured imprint material is present under the outlet 50a, the processing advances to step S720. On the other hand, in a case where the uncured imprint material is present under the outlet 50a, the processing advances to step S722.

In step S720, because the shot region on which the gas blown out from the outlet 50a of the forming unit 50 directly hits the uncured imprint material is present, the flow amount of the gas blown out from the outlet 50a is not changed and is maintained as the second flow amount.

In step S722, because the shot region on which the gas blown out from the outlet 50a of the forming unit 50 directly hits the uncured imprint material is not present, the flow amount of the gas blown out from the outlet 50a is increased and is returned from the second flow amount to the first flow amount.

In step S724, similarly to step S708, a pattern of the imprint material is formed on the next target shot region.

In step S726, it is determined whether or not the pattern of the imprint material has been formed on all of the plurality of shot regions on which uncured imprint material was supplied. In a case where a pattern of the imprint material has not been formed on all of the plurality of shot regions on which the uncured imprint material was supplied, the processing transitions to step S716 in order to form a pattern of the imprint material onto a next target shot region. Meanwhile, in a case where a pattern of the imprint material has been formed on all of the plurality of shot regions on which the uncured imprint material was supplied, the substrate 1 is unloaded from the imprint apparatus 100 and the imprint processing ends.

By virtue of the imprint processing in the imprint apparatus illustrated in FIG. 6A to FIG. 6C, it is similarly possible to prevent the gas blown out from the outlet 50a of the forming unit 50 from hitting uncured imprint material supplied onto the substrate. Therefore, in the imprint apparatus 100, it is possible to prevent evaporation of uncured imprint material supplied on the substrate and to form with high accuracy a pattern of the imprint material on the substrate.

In the above described embodiment, although a case where the flow amount blown out from the outlet 50a of the forming unit 50 is the first flow amount and the second flow amount has been described, the flow amount is not limited to this and may be further adjusted. For example, when the gas blown out from the outlet 50a directly hits the uncured imprint material while the substrate moves, the second flow amount is set, and when the gas directly hits the substrate in a stopped state, the flow amount may be set to a third flow amount smaller than the second flow amount. As described above, the flow amount may be changed in accordance with the relative position between the outlet 50a of the forming unit 50 and the substrate.

The pattern of a cured product formed using the imprint apparatus 100 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 8A:
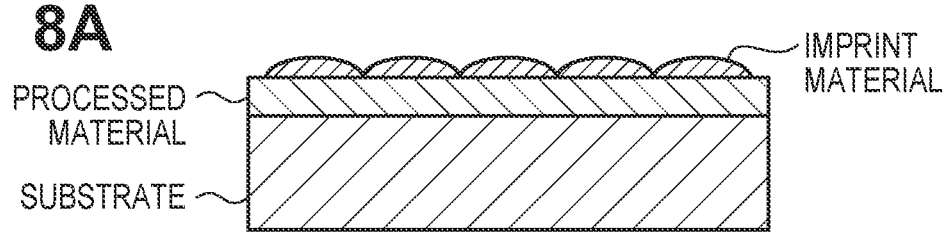
FIG. 8A to FIG. 8F are views for describing an article manufacturing method.

Next, description regarding a detailed method of manufacturing an article is given. As illustrated in FIG. 8A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 8B:
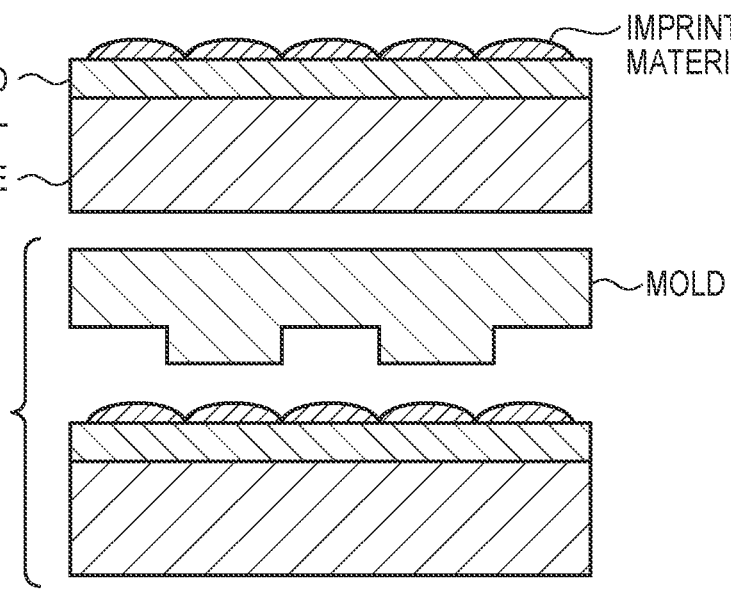
Figure 8C:
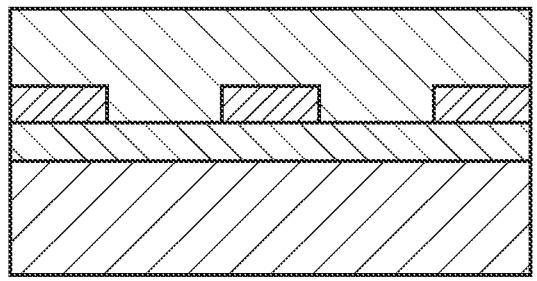

As shown in FIG. 8B, a side of the mold for imprint with a concave-convex pattern is formed on and caused to face the imprint material on the substrate. As illustrated in FIG. 8C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 8D:
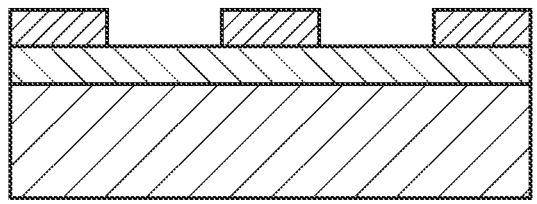

As shown in FIG. 8D, after the imprint material is cured, the mold is released from the substrate. Thus, the pattern of the cured product of the imprint material is formed on the substrate. In the pattern of the cured product, the concave portion of the mold corresponds to the convex portion of the cured product, and the convex portion of the mold corresponds to the concave portion of the cured product. That is, the concave-convex pattern of the mold $4z$ is transferred to the imprint material.

Figure 8E:
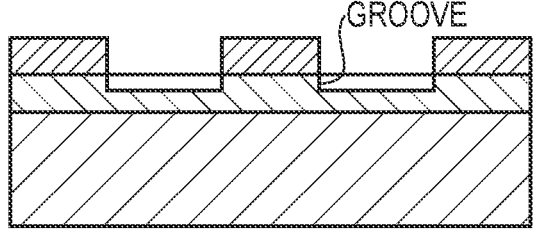
Figure 8F:
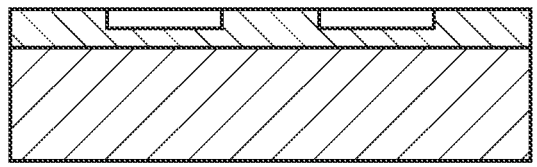

As shown in FIG. 8E, when etching is performed using the pattern of the cured product as an etching resistant mask, a portion of the surface of the processed material where the cured product does not exist or remains thin is removed to form a groove. As shown in FIG. 8F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-142522 filed on Aug. 1, 2019, which is hereby incorporated by reference herein in its entirety.

What is claimed is:

1. An imprint apparatus for performing imprint processing of forming a pattern of an imprint material on a substrate by using a mold, the imprint apparatus comprising:
a forming unit including a plurality of outlets configured to blow out a gas towards a substrate side from a mold side and configured to form, by the gas, an air flow that surrounds a space between the mold and the substrate;
a processor; and
a memory including instructions stored thereon that, when executed by the processor, cause the imprint apparatus to:

control the forming unit such that, based on a positional relationship between each of the plurality of outlets and an uncured imprint material supplied to a plurality of shot regions, flow amounts of the gas blown out from each of the plurality of outlets are individually adjusted when the imprint processing is consecutively performed on the plurality of shot regions on the substrate after the uncured imprint material has been supplied thereto, and in a case where in the imprint processing, there is the uncured imprint material under an outlet among the plurality of the outlets in a state in which at least one shot region among the plurality of shot regions and the mold face each other, control the forming unit such that a flow amount of the gas blown out from the outlet becomes a second flow amount which is less than a first flow amount of the gas blown out from the outlet in a case where there is no uncured imprint material under the outlet.

2. The imprint apparatus according to claim 1, wherein the instructions, when executed by the processor, further cause the imprint apparatus to control the forming unit such that a flow amount of the gas blown out from the outlet during movement of the substrate becomes smaller than a flow amount of the gas blown out from the outlet while the substrate is stationary.

3. The imprint apparatus according to claim 1, wherein the instructions, when executed by the processor, further cause the imprint apparatus to control the forming unit such that, from among the plurality of outlets, a flow amount of the gas blown out from an outlet under which the uncured imprint material is present becomes smaller than a flow amount of the gas blown out from an outlet under which the uncured imprint material is not present.

4. The imprint apparatus according to claim 1, wherein the plurality of shot regions include a first shot region and a second shot region onto which the uncured imprint material is supplied, and
when the imprint processing is consecutively performed on the first shot region and the second shot region, in a case where a flow amount of the gas blown out from the outlet in the imprint processing onto the first shot region is set to the second flow amount, the instructions, when executed by the processor, further cause the imprint apparatus to control whether a flow amount of the gas blown out from the outlet in the imprint processing onto the second shot region is maintained as the second flow amount or returned from the second flow amount to the first flow amount.

5. The imprint apparatus according to claim 4, wherein the instructions, when executed by the processor, further cause the imprint apparatus to control the forming unit to, in a case where the uncured imprint material is present under the outlet in a state in which the second shot region and the mold are facing each other, maintain a flow amount of the gas blown out from the outlet as the second flow amount, and in a case where the uncured imprint material is not present under the outlet, return the flow amount of the gas blown out from the outlet from the second flow amount to the first flow amount.

6. The imprint apparatus according to claim 1, wherein the forming unit includes a first forming unit and a second forming unit independent of each other, and
wherein the instructions, when executed by the processor, further cause the imprint apparatus to individually control a flow amount of the gas blown out from outlets of each of the first forming unit and the second forming unit.

7. The imprint apparatus according to claim 6, wherein the first forming unit and the second forming unit are arranged with the mold therebetween.

8. The imprint apparatus according to claim 1, wherein the forming unit is arranged so as to surround the mold.

9. The imprint apparatus according to claim 1, wherein the instructions, when executed by the processor, further cause the imprint apparatus to supply the uncured imprint material to the each of the plurality of shot regions.

10. The imprint apparatus according to claim 1, wherein the instructions, when executed by the processor, further cause the imprint apparatus to load a substrate onto which the uncured imprint material has been supplied to each of the plurality of shot regions.

11. An imprint apparatus for forming a pattern of an imprint material on a first shot region and a second shot region of a substrate using a mold, comprising:
a gas supply unit, which includes an outlet through which a gas is blown out toward the substrate, configured to supply the gas so as to surround a space between the mold and the substrate;
a processor; and
a memory including instructions stored thereon that, when executed by the processor, cause the imprint apparatus to:
control, in a state in which the imprint material is supplied to the first shot region and the second shot region, so as to form the pattern on the second shot region after forming the pattern on the first shot region, wherein
cause a flow amount of a gas blown out from the outlet located at a position facing the second shot region when the pattern is formed in the first shot region in a state in which the first shot region and the mold face each other to be reduced, and
cause the flow amount of the gas blown out from the outlet when the outlet is at the position facing the second shot region to be more reduced than the flow amount of the gas blown out from the outlet when the outlet is not at the position facing the second shot region.

12. An imprint apparatus for forming a pattern of an imprint material on a first shot region and a second shot region of a substrate using a mold, comprising:
a gas supply unit, which includes a first outlet and a second outlet through which a gas is blown out toward the substrate, configured to supply the gas so as to surround a space between the mold and the substrate;
wherein the first outlet is arranged at a position facing the second shot region when the pattern is formed on the first shot region, and the second outlet is arranged at a position not facing the second shot region when the pattern is formed on the first shot region, and
a processor; and
a memory including instructions stored thereon that, when executed by the processor, cause the imprint apparatus to:
control, in a state in which the imprint material is supplied to the first shot region and the second shot region, so as to form the pattern on the second shot region after forming the pattern on the first shot region, wherein
cause a flow amount of a gas blown out from the outlet located at a position facing the second shot region when the pattern is formed in the first shot region in a state in which the first shot region and the mold face each other to be reduced, and
cause a flow amount of a gas blown out from the first outlet to be reduced more than a flow amount of a gas blown out from the second outlet when the pattern is formed on the first shot region.

13. An imprint apparatus for performing imprint processing of forming a pattern of an imprint material on a substrate by using a mold, the imprint apparatus comprising:
a forming unit including an outlet configured to blow out a gas towards a substrate side from a mold side and configured to form, by the gas, an air flow that surrounds a space between the mold and the substrate;
a processor; and
a memory including instructions stored thereon that, when executed by the processor, cause the imprint apparatus to:
control the forming unit when the imprint processing is consecutively performed on a plurality of shot regions on the substrate after an uncured imprint material has been supplied thereto, and
in a case where in the imprint processing, there is the uncured imprint material under the outlet in a state in which at least one shot region among the plurality of shot regions and the mold face each other, controls control the forming unit such that a flow amount of the gas blown out from the outlet becomes a second flow amount which is less than a first flow amount of the gas blown out from the outlet in a case where there is no uncured imprint material under the outlet and a flow amount of the gas blown out from the outlet during movement of the substrate becomes smaller than a flow amount of the gas blown out from the outlet while the substrate is stationary.

14. An imprint apparatus for performing imprint processing of forming a pattern of an imprint material on a substrate by using a mold, the imprint apparatus comprising:
a forming unit including an outlet configured to blow out a gas towards a substrate side from a mold side and configured to form, by the gas, an air flow that surrounds a space between the mold and the substrate;
a processor; and
a memory including instructions stored thereon that, when executed by the processor, cause the imprint apparatus to:
supply an uncured imprint material to the each of a plurality of shot regions,
control the forming unit when the imprint processing is consecutively performed on the plurality of shot regions on the substrate after the uncured imprint material has been supplied thereto, and
in a case where in the imprint processing, there is the uncured imprint material under the outlet in a state in which at least one shot region among the plurality of shot regions and the mold face each other, controls control the forming unit such that a flow amount of the gas blown out from the outlet becomes a second flow amount which is less than a first flow amount of the gas blown out from the outlet in a case where there is no uncured imprint material under the outlet.

* * * * *